SILICON SEMICONDUCTOR DEVICES

Filed Jan. 31, 1957

WITNESSES
Robert C. Baird
Wm. B. Sellers.

INVENTORS
Herbert W. Henkels &
David L. Moore.
BY
Frederick Shapoe
ATTORNEY

United States Patent Office 2,964,830

Patented Dec. 20, 1960

2,964,830

SILICON SEMICONDUCTOR DEVICES

Herbert W. Henkels, Milford Township, Somerset County, and David L. Moore, Hempfield Township, Westmoreland County, Pa., assignors to Westinghouse Electric Corporation, East Pittsburgh, Pa., a corporation of Pennsylvania Filed Jan. 31, 1957, Ser. No. 637,472

1 Claim. (Cl. 29—25.3)

This invention relates to semiconductor devices comprising silicon and, in particular, fused diodes having P–N junctions, and processes for efficiently producing the same.

While it has been proposed heretofore to prepare silicon semiconductor devices having P–N junctions, the materials employed for the components thereof have been of such a nature that great difficulties have been encountered in producing satisfactory and uniformly reliable units. In particular, the quality of the units has not been as high as reasonably possible from the theoretical optimum characteristics of the silicon. Thus, silicon semiconductor diodes should be capable of withstanding voltages of 600 volts and even more. However, prior art procedures have resulted in a high proportion of silicon diodes that could not be employed at voltages in excess of 100 or 200 volts without short-circuiting or other failures. By careful checking and selection, there have been obtained only a small proportion of silicon diodes that could be satisfactorily employed at 300 volts or somewhat higher.

A further shortcoming resulting from prior art practices for producing silicon semiconductor devices has been the lack of reproducibility and uniformity of quality. Slight variations in manufacturing procedures or in the compositions of the materials employed for the contact portions of the semiconductor devices has resulted in great variation in the efficiency, operating voltage and quality thereof.

The object of this invention is to provide a silicon semiconductor device embodying at least one contact member comprising tantalum or an alloy of tantalum, the contact member including a flat contact face portion and a long, relatively flexible shank portion.

A further object of the invention is to provide a fused junction silicon semiconductor device embodying at least one contact member of tantalum or an alloy of tantalum that is capable of use at potentials of 600 volts and higher.

A still further object is to provide a process for treating a fused silicon semiconductor diode with an etchant such that the rectifying P–N junction has outstanding electrical properties.

Other objects of the invention will, in part, be obvious and will, in part, be set forth hereinafter.

For a better understanding of the nature and objects of the invention, attention is directed to the accompanying drawings, in which.

In view of the relatively fragile nature of the silicon wafers that are employed for semiconductor devices, extreme care and precision are necessary in processing and assembling devices embodying such silicon wafers. The silicon wafers ordinarily are of a thickness of from about 5 to 15 mils. In these thicknesses, the silicon wafers will break or shatter if they are subjected to any appreciable mechanical stress. Breakage of the silicon wafers may be encountered not only during the manufacturing and assembly processes applied to them, but also during use when, by reason of the thermal expansion that takes place on being heated by the passage of electrical current, the silicon wafer may be stressed with relation to the contact to which it is affixed.

In order to prepare silicon rectifiers and other semiconductor devices from silicon wafers, it is critically necessary to provide a metallurgical bond between at least one surface of the silicon wafer and a base contact so that heat developed during use may be dissipated rapidly to the base contact and from the latter to a suitable heat dissipator.

The silicon wafer in the semiconductor device must be provided with flexible current leads to the other face opposite to the base contact face, so that the silicon wafer is not subjected to undue stresses from rigid leads during use.

We have discovered that semiconductor devices and, in particular, silicon diodes, may be prepared from silicon providing there is employed for the base contact a relatively large area member of a metal selected from the group consisting of molybdenum, tungsten and tantalum, and base alloys thereof, while the other or upper contact is of tantalum or an alloy of tantalum and tungsen, and comprises a flat face and an integral, relatively long and flexible current carrying lead. Tantalum and tantalum base alloys comprising up to 50% tungsten have given good results. Such other contact may be prepared from strips of tantalum which are bent at one end to provide an L-shaped member such that the horizontal leg of the L constitutes a flat contact face while the longer vertical leg is relatively resilient and provides for an electrical conducting lead thereto. Alternatively, the tantalum contact may comprise a nail-shaped member in which the head of the nail constitutes a flat face for a contact while the shank is relatively flexible and enables electrical current to be carried thereby. Numerous advantages flow from the use of tantalum for the last-mentioned contact member as will be set forth hereinafter. It will be understood that slight variation and modifications in the structure of the tantalum upper contact member may be effected in accordance with the present invention.

Figure 1:
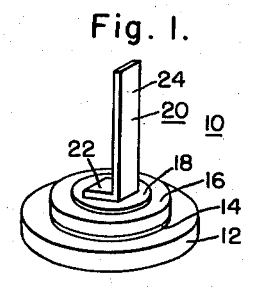
Fig. 1 is an elevation through one semiconductor device constructed in accordance with the invention.

Reference should be had to Fig. 1 of the drawing wherein there is illustrated a semiconductor diode 10 having an L-shaped tantalum upper contact member attached thereto. The diode 10 comprises a base contact 12 of molybdenum, tungsten, tantalum or base alloys thereof. A layer of silver base solder 14 is applied to the surface of the base contact 12 in order to provide for maintaining a fused metallurgical bond therewith and with a silicon wafer 16 disposed on the base contact. To the upper surface of the silicon wafer 16 is fused a layer 18 of an aluminum metal selected from the group consisting of aluminum and aluminum base alloys. The layer 18 forms the counterelectrode and is smaller in area than wafer 16 and is contained therein so that all the edges are spaced from the wafer edges. An L-shaped upper contact member 20 of tantalum comprising a flat face 22 as the horizontal leg is fused to the upper surface of the layer 18 of aluminum metal. The vertical leg 24 of the tantalum contact member 20 is relatively flexible and provides for carrying electrical current to the diode.

Figure 2:
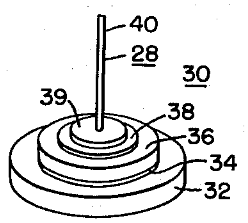
Fig. 2 is a view in elevation of a modified form of the invention.

In Fig. 2 there is illustrated a modified form of semiconductor diode 30. The diode 30 comprises a relatively large base contact 32 of a metal selected from the group consisting of molybdenum, tungsten, tantalum and base alloys thereof. A layer of silver base solder 34 fusibly joins a relatively smaller silicon wafer 36 to the base 32. A still smaller layer 38 of an aluminum metal is fused to the upper surface of the silicon wafer 36 and to a nail-shaped tantalum member 28 which comprises a head 39 and a relatively flexible shank 40.

In preparing the diode 30 of Fig. 2 in accordance with the invention, an assembly is prepared by placing upon the base contact 32 (1) a layer 34 of a foil prepared from a silver base alloy, (2) the silicon wafer 36, (3) an aluminum foil 38, and (4) then superimposing the tantalum contact member 28. The assembly is heated in a vacuum in a temperature of between 800° C. and 1000° C. for a period of several minutes while under a light pressure of 50 to 100 grams per square centimeter. The fused assembly is slowly cooled.

The fused assembly must be subjected to a thorough but controlled etching treatment in order to insure that the exposed junction between the aluminum layer 38 and the silicon wafer is clean in order to prevent any short circuits or inefficient operation of the resulting diode. It has been discovered that the surfaces of the silicon wafer may be contaminated, so as to be affected adversely by the use of an etching solution that contains dissolved impurities. Consequently, it is desirable to use high purity virgin etching agents and to discard the etching solution after it has been once applied to the semiconductor devices.

If the base contact 32 comprises tantalum or tantalum alloy, then the entire diode may be immersed in a small quantity of the etching agent. After agitation or relative motion in the etching agent for a few seconds, the diode should be removed and the etching material discarded. Two or three separate quantities of fresh etching agent may be necessary to secure an optimum operating diode device. After the etching, the diode should be washed repeatedly with pure water, ethyl alcohol or other cleaning solvent.

Figure 3:
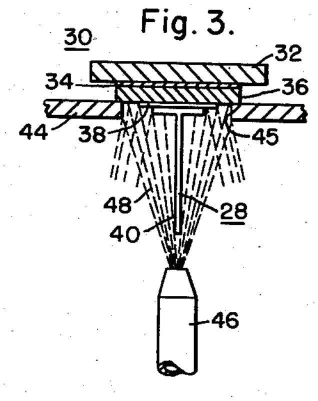
Fig. 3 is a fragmentary vertical cross section illustrating the etching of the semiconductor device.

It has been found possible to secure outstanding diodes by employing a slightly modified etching procedure usable with any of the base contact materials, as illustrated in Fig. 3 of the drawing. The diode 30 is inverted and placed on a mask 44 of a suitable inert material such as graphite, platinum, tantalum, polytetrafluoroethylene resin or the like. The mask 44 is provided with an aperture 45 of a size slightly smaller than that of the silicon wafer 36, but somewhat larger than the aluminum layer 38 so that there is a space between the peripheral edge of the aluminum layer 38 and the walls of aperture 45. The tantalum contact 28 of nailhead shape is disposed downwardly through the aperture 45 as illustrated. There is then sprayed or flowed through a nozzle 46 a stream of pure etching agent 48 so directed as to wash over the surfaces of the aluminum member 38 and the exposed surface of the silicon wafer 36. A relatively small quantity, of the order of 10 to 20 cc., of the etching agent is sufficient to thoroughly clean a diode in which the diameter of the aluminum layer is of the order of one-half inch. The etching agent is discarded after such use. Then a stream of distilled water is sprayed upon the surfaces to remove all traces of the etching agent. Thereafter, the semiconductor member may be dried. Suitable etching agents comprise a mixture of equal parts by volume of nitric acid and hydrofluoric acid. The hydrofluoric acid comprises 48% to 50% HF and the nitric acid is of 25% concentration. Other suitable etchants for silicon are well known.

The etching agent will not affect or etch the tantalum or tantalum alloy and, therefore, no impurities will be applied to the silicon as a result of the flow of the etching agent in the procedure illustrated in Fig. 3. Any other known material for the upper contact 28 will not produce as satisfactory results as will tantalum in the etching procedure illustrated in Fig. 3.

Figure 4:
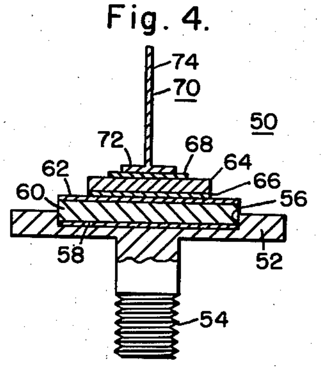
Fig. 4 is a vertical cross section through a screw base semiconductor device.

For a more detailed illustration of the construction of the semiconductor devices of the invention, reference is to be had to Fig. 4 of the drawing wherein there is shown a semiconductor diode 50 which is suitable for screwing into panels and other devices. The diode 50 comprises a screw base 52 having a threaded extension 54. In the upper face of the screw base 52 is provided a recess 56 within which is disposed a base contact 60 of molybdenum, tungsten or tantalum or base alloys thereof attached by a layer of solder 58 to the base 52. When the base contact 60 comprises molybdenum or tungsten, it may be provided with a coating 62 of nickel on the upper surface, or both the upper and lower surfaces. It will be understood that the nickel may be applied by electrodeposition, by chemical precipitation, by cladding or other suitable procedures.

There is applied to the tantalum base contact 60, or to the nickel coated upper surface of a molybdenum base contact 60, a wafer 64 of silicon previously cut to suitable size and shape. The silicon wafer has been lapped and etched to produce a wafer having desired semiconductor characteristics. The wafer will be doped with an N-type doping impurity in order to impart thereto N-type semiconductivity.

A thin layer of silver base solder 66 fusibly joins the silicon wafer 64 to the base contact 60. The term "solder" as employed herein includes high and low melting point alloys of silver. Suitable silver base solders are composed of silver and either an element of group IV of the periodic table, or an N-type doping impurity, or both. The alloys are composed of at least 5% silver, the balance not exceeding 90% by weight of tin, not exceeding 20% by weight of germanium and not exceeding 95% by weight of lead, and a small proportion of antimony or other N-type doping impurity. Particularly good results have been obtained with following binary alloys in which all parts are by weight, comprising 35% to 10% of silver and from 65% to 90% of tin; 95% to 84% of silver and from 5% to 16% of silicon; 75% to 50% of silver and from 25% to 50% or lead; and 95% to 70% of silver and from 5% to 30% of germanium. Ternary alloys of silver, tin and silicon; silver, lead and silicon; and silver, germanium and silicon are particularly advantageous. For example, the ternary alloys may comprise 50% to 80% silver and 5% to 16% silicon, the balance being tin, lead or germanium. The silver alloy may include small amounts of other elements and impurities, providing however, that no significant amount of a group III element is present. The silver base solder may include up to 10% by weight of antimony. Thus, good results may be obtained using solders containing (1) 98% silver, 1% lead and 1% antimony; (2) 80% silver, 16% lead and 4% antimony; and (3) 85% silver, 5% silicon, 8% lead and 2% antimony.

When these silver alloy solders are applied to the silicon wafer, some of the silicon from the wafer dissolves in the alloy and, consequently, binary and ternary alloys which are applied without silicon being present therein will, after fusion, contain a small but substantial amount of silicon. Thus, an alloy comprising 84% silver, 1% antimony, 10% tin and 5% germanium applied to a silicon wafer will, after fusion, contain from 5% to 16% by weight of silicon, depending upon the length of time and the temperatures to which the solder alloy and the silicon are subjected.

Excellent results have been obtained with alloys comprising from 1% to 4% by weight of lead, from 1% to 4% antimony, and the balance, 98% to 95%, being silver. Thin sheets of these ternary silver alloys have been applied to the silicon wafers and after heating the assembly to brazing temperatures, the silver alloy melts and dissolves some of the silicon, and a portion of the silicon diffuses therein so that the fuse bonding layer may comprise from 5% to 16% by weight of silicon, about 1% to 4.0% by weight each of lead and antimony, and the balance being silver. The lead-antimony-silver alloy is ductile and may be readily rolled into thin films of a thickness of from 1 to 2 mils. The thin films may be then cut or punched into small pieces of approximately the same area as the silicon wafers and applied thereto.

The silver base alloy may be prepared in powder or granular form and a thin layer thereof applied to the end contact either dry or in the form of a paste in a volatile solvent, such as ethyl alcohol.

Upon the upper surface of the wafer 64 there is placed a thin layer 68 of an aluminum metal. The layer 68 may comprise a film or foil of aluminum or of an aluminum base alloy and preferably an aluminum with an element of either group III or group IV, or both, of the periodic table. The aluminum member must comprise a material which, when fused to the silicon wafer 64 will dissolve some of the underlying silicon, and when cooled will redeposit silicon having P-type conductivity on the upper portions of the wafer 64.

The layer 68 may comprise pure aluminum with only slight amounts of impurities being present, such as magnesium, zinc, and the like; or an alloy composed of aluminum as a major component, the balance being silicon, gallium, indium, and germanium, individually, or any two or all of the latter being present. These alloys should be solid up to at least about 300° C. Thus, a foil of 95% aluminum and 5% silicon; 88.4% aluminum and 11.6% silicon; 90% aluminum and 10% germanium; 47% aluminum and 53% germanium; 88% aluminum and 12% indium; 96% aluminum and 4% by weight of indium; 50% aluminum, 20% silicon, 20% indium and 10% germanium; 90% aluminum, 5% silicon, and 5% indium; 85% aluminum, 5% silicon, 5% indium and 5% germanium; and 88% aluminum, 5% silicon, 2% indium, 3% germanium and 2% gallium may be employed (all parts being by weight). It is critical that the aluminum layer 68 be substantially smaller than the area of the silicon wafer 64 and that it be centered on the wafer 64 with a substantial clearance from the corners or edge of the wafer. It is not necessary that the aluminum layer 68 be a foil or a separate layer. We have found it possible to vapor-coat the aluminum or the aluminum base alloy on the silicon wafer in a vacuum. The selected central portions of the upper surface of the silicon wafer may be vapor-coated with aluminum or aluminum base alloy, by masking the edges of the wafer, or the upper contact itself may be vapor-coated with the aluminum metal.

Upon the upper surface of the layer 68 of aluminum is disposed a tantalum or tantalum alloy contact 70 comprising a nailhead 72 fused to the layer 68. The shank 74 is relatively flexible and resilient so that no undue stress is applied thereby to the silicon wafer 64 under conditions of manufacture and use.

In preparing the diode of Fig. 4, the assembly comprising the base contact 60, the silver solder 66, the silicon wafer 64, the aluminum member 68 and the upper tantalum contact member 70 is heated while being maintained together under light pressure to a temperature of approximately 800° C. to 1000° C. while under vacuum. In a short period of time the silver solder 66 will have fused and joined the base 60 to the silicon wafer 64. Likewise, the aluminum layer 68 will have fused, and on cooling, it will have bonded to the tantalum contact 70 and a metallurgical bond is effected to the upper surface of the silicon wafer 64. During the heating, aluminum will dissolve the adjacent silicon on the upper surface of the silicon wafer, and on cooling, dissolved silicon with P-type conductivity is redeposited, thereby converting the adjacent surface portions into silicon with P-type semiconductivity whereby a P–N junction is present. When the fused assembly is cooled to room temperature, it is etched, preferably in the manner illustrated in Fig. 3 of the drawing. After etching, the fused assembly is then placed within the recess 56 of the screw base 52 with a low melting point solder 58 which melts below 300° C, for example, being applied in order to fusibly bond the diode assembly to the member 52. Temperature during this last operation should not exceed approximately 400° C. The diode 50 of Fig. 4 of the drawing may be then encapsulated or placed in a hermetical metal case in order to protect the silicon and other portions of the assembly from the atmosphere.

Figure 5:
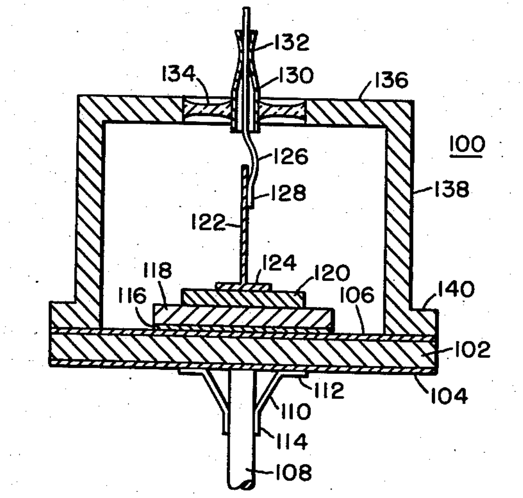
Fig. 5 is a vertical cross section through another complex semiconductor device.

Fig. 5 illustrates a modified form of assembly conductor device 100. This device comprises a base contact 102, which if of molybdenum or tungsten is nickel coated on both the lower and upper surfaces to provide layers 104 and 106, respectively, of nickel. If the base contact 102 comprises tantalum or tantalum base alloys, it need not be nickel plated. Tantalum, therefore, possesses the advantage of not requiring a nickel plate coating. A lead 108 is affixed to the bottom of the base contact 102. The lead 108 is provided with an eyelet 110 which is welded through a sleeve 114 to the lead. Flange 112 of the eyelet is welded to the coating 104 of the contact 102. In some cases, the lead 108 may be affixed by electric fusion welding to the base contact 102. A layer 116 of a silver base solder metallurgically bonds a silicon wafer 118 to the base 102. An aluminum layer 120 is fused to the upper surface of the silicon wafer 118 and to the head 124 of a nail-shaped tantalum member 122. A flexible lead 126 is affixed by welding the lower end thereof at 128 to the shank of the tantalum member 122. The lead 128 passes through a sleeve 130 which is crimped and welded at 132 to provide a hermetic seal thereat.

The sleeve 132 may comprise an alloy such as an iron, nickel and cobalt alloy known as Kovar alloy. The sleeve 130 is disposed within an encircling insulating disc 134 of glass which is fused to the sleeve 130 and to an apertured cup 136. The apertured cup comprises vertical walls 138 terminating in a peripheral flange 140 which is welded to the base 102, thereby providing a hermetic enclosure for the entire member. It will be understood that the apertured cup 136 is evacuated previous to the welding of the flange 140 and the sealing of the tube 130 whereby a selected inert atmosphere exists within the interior of the diode 100.

Diodes, such as those shown in Fig. 5 of the drawing, have been consistently able to withstand peak A.C. potentials of from 300 to 600 volts. Currents of up to 200 amperes have been rectified by a silicon wafer of a diameter of approximately one-half inch.

It will be understood that the above description and drawings are illustrative and not limited.

We claim as our invention:

In the process of producing a semiconductor device, the steps comprising (A) heating to a maximum temperature of between 800° C. and 1000° C. a superimposed assembly of (1) an end contact composed of a metal from the group consisting of molybdenum, tungsten and tantalum and base alloys thereof, (2) a thin layer of a silver solder, (3), a wafer of N-type silicon, (4) a thin layer of an aluminum material selected from the group consisting of aluminum and aluminum base alloys, said layers capable of conferring P-type semiconductivity to the silicon wafer, and (5) another contact member of a metal selected from the group consisting of tantalum and tantalum base alloys applied to the layer of aluminum material, the said another contact member comprising a flat base of an area less than the layer and disposed entirely within the layer of the aluminum material, and having a projecting portion at substantially right angles to the flat base, whereby the silver solder fuses and joins the end contact to the silicon wafer and the thin layer of aluminum material fuses to the said other contact member and to the silicon wafer, and the layer of the aluminum material dissolving silicon from the adjacent surface of the silicon wafer, (B) cooling the fused device whereby to redeposit silicon having P-type conductivity from the layer of the aluminum material, and thereby producing a bonded unitary device having a P–N junction, (C) applying to the device a mask having an aperture smaller than that of the silicon wafer and larger than the layer of aluminum material with the layer of aluminum material centered in the aperture and the tantalum member projecting through the aperture, and flowing an etching agent at the portion of the device exposed through the aperture so as to etch only the exposed aluminum material and exposed portions of the silicon wafer, the tantalum member being unaffeced by the etchant.

References Cited in the file of this patent

UNITED STATES PATENTS

| | | |
|---|---|---|
| 2,438,110 | Brattain | Mar. 23, 1948 |
| 2,441,603 | Storks et al. | May 18, 1948 |
| 2,763,822 | Frola et al. | Sept. 18, 1956 |
| 2,806,187 | Boyer et al. | Sept. 10, 1957 |
| 2,820,932 | Looney | Jan. 21, 1958 |
| 2,854,612 | Zaratkiewicz | Sept. 30, 1958 |